US012021050B2

(12) United States Patent
Tsai et al.

(10) Patent No.: US 12,021,050 B2
(45) Date of Patent: Jun. 25, 2024

(54) SEMICONDUCTOR DEVICE

(71) Applicant: TAIWAN SEMICONDUCTOR MANUFACTURING COMPANY LTD., Hsinchu (TW)

(72) Inventors: Ming-Ho Tsai, Hsinchu (TW); Jyun-Hong Chen, Taichung (TW); Chun-Chen Liu, Kaohsiung (TW); Yu-Nu Hsu, Tainan (TW); Peng-Ren Chen, Hsinchu (TW); Wen-Hao Cheng, Hsinchu (TW); Chi-Ming Tsai, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 44 days.

(21) Appl. No.: 17/814,840

(22) Filed: Jul. 26, 2022

(65) Prior Publication Data

US 2022/0367396 A1    Nov. 17, 2022

Related U.S. Application Data

(62) Division of application No. 16/353,425, filed on Mar. 14, 2019, now Pat. No. 11,469,198.

(60) Provisional application No. 62/698,614, filed on Jul. 16, 2018.

(51) Int. Cl.
 *H01L 23/00* (2006.01)
(52) U.S. Cl.
 CPC .............. *H01L 24/11* (2013.01); *H01L 24/13* (2013.01); *H01L 24/14* (2013.01); *H01L 2224/11462* (2013.01); *H01L 2224/11618* (2013.01); *H01L 2224/117* (2013.01); *H01L 2224/11849* (2013.01); *H01L 2224/13026* (2013.01); *H01L 2224/13147* (2013.01); *H01L 2224/1403* (2013.01)

(58) Field of Classification Search
 None
 See application file for complete search history.

(56) References Cited

U.S. PATENT DOCUMENTS

| 9,905,527 | B1* | 2/2018 | Hacker | H01L 24/81 |
| 2005/0194695 | A1* | 9/2005 | Lin | H01L 25/0657 |
| | | | | 257/E21.705 |
| 2013/0193570 | A1* | 8/2013 | Kuo | H01L 24/13 |
| | | | | 257/737 |

* cited by examiner

*Primary Examiner* — Hung K Vu
(74) *Attorney, Agent, or Firm* — WPAT LAW; Anthony King

(57) ABSTRACT

A semiconductor device including: a first formation site and a second formation site for forming a first conductive bump and a second conductive bump; when a first environmental density corresponding to the first formation site is greater than a second environmental density corresponding to the second formation site, a cross sectional area of the second formation site is greater than a cross sectional area of the first formation site; wherein the first environmental density is determined by a number of formation sites around the first formation site in a predetermined range and the second environmental density is determined by a number of formation sites around the second formation site in the predetermined range; wherein a first area having the first environmental density forms an ellipse layout while a second area having the second environmental density forms a strip layout surrounding the ellipse layout.

20 Claims, 17 Drawing Sheets

(A)

(B)

(C)

(D)

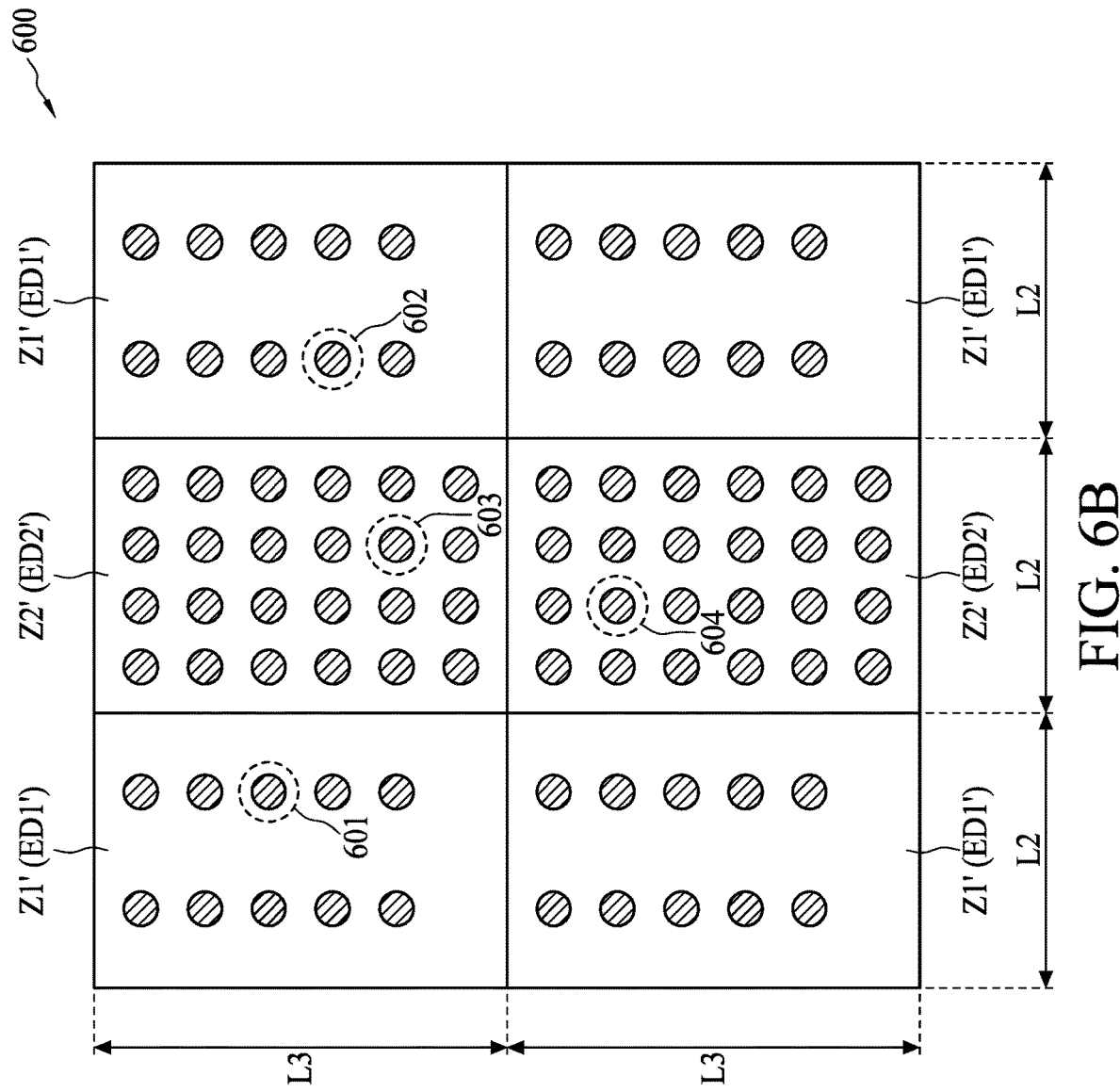

SEMICONDUCTOR DEVICE

CROSS-REFERENCE TO RELATED APPLICATION

This application is a divisional of U.S. application Ser. No. 16/353,425, filed on Mar. 14, 2019, which claims the benefit of U.S. Provisional Application No. 62/698,614, filed on Jul. 16, 2018, which is incorporated by reference in its entirety.

BACKGROUND

Wafer bumping is an essential procedure to a semiconductor packaging process such as a flipchip package or a board level package. Bumping is an advanced wafer level process technology where bumps made of solder are formed on the wafers in a whole wafer form before the wafer is being diced into individual chips. These bumps, which can be composed from gold, lead, solder, nickel or copper on wafer are the fundamental interconnect components that will interconnect the die and the substrate together into a single package. These bumps not only provide a connected path between die and substrate, but also play an important role in the electrical, mechanical and thermal performance. However, a poor height uniformity of these bumps formed on the wafer might introduce a reliability issue for the circuitry.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6B is a diagram illustrating a die divided into zones based on different environmental density according to an embodiment of the present disclosure.

DETAILED DESCRIPTION

Figure 1:
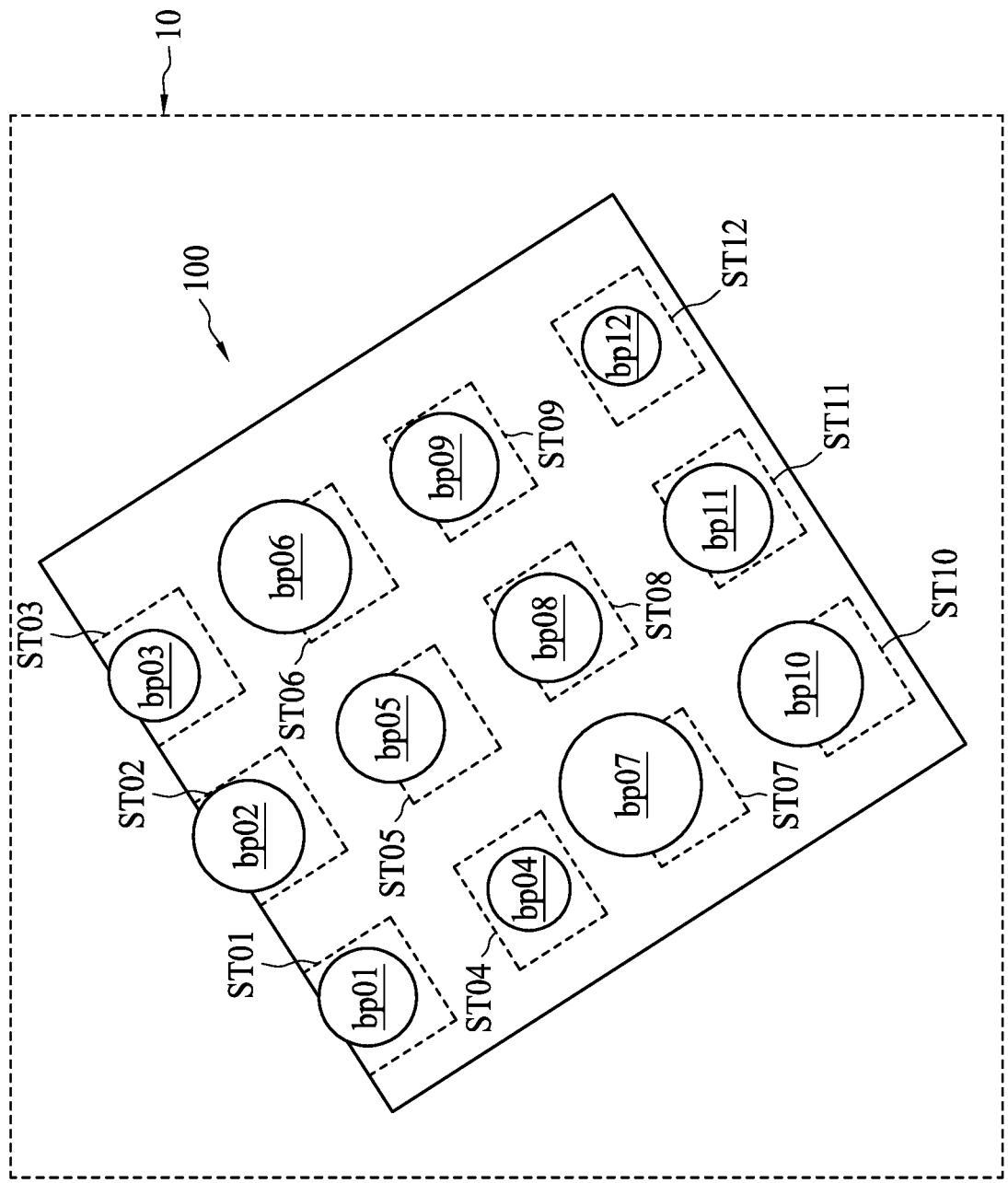
FIG. 1 is a diagram illustrating conductive bumps formed on a die implemented on a wafer according to an embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 is a diagram illustrating conductive bumps bp01-bp12 formed on a die 100. The die 100 is on a part of a wafer 10 (marked by dashed line) according to an embodiment of the present disclosure. The conductive bumps bp01-bp12 are formed on the die 100 and each of bumps bp01-bp12 is formed on a corresponding formation site ST01-ST12. The bumps bp01-bp12 can be attached to the corresponding formation sites ST01-ST12 by different methods. For example, electroplating, solder paste transfer-printing, evaporation and solder ball direct adhesion, etc. It should be noted that the number of conductive bumps formed on the die 100 and the shape of the corresponding formation site are only for illustrative purpose. Those skilled in the art should understand the number of bumps formed on the die 100 is determined based on the layout of the die 100. Moreover, the distance between any two adjacent bumps may not be the same. In other words, the number of bumps included within a certain range on the die 100 may not be the same. In addition, the formation sites ST01-ST12 are manufactured during the operation of forming bumps bp01-bp12, and the detail of manufacturing the formation sites will be described in the following paragraphs.

To achieve the goal of mass production, the bumps bp01-bp12 on the die 100 are simultaneously formed with a same operation. In some examples, the bumps bp01-bp12 on die 100 are simultaneously formed under the same procedures or parameters. However, the inter-bump height uniformity when the forming procedure is finished might be too big to ignore due to the different loading effect for forming each bump. For example, the bumps bp01, bp03, bp04 and bp12 are relatively shorter while the bumps bp06 and bp07 are relatively higher even those bumps are simultaneously formed. The height deviation between the bumps bp01-bp12 may introduce a reliability issue and reduce the yield rate of the wafer 10. The embodiments of the present disclosure propose methods for forming bumps and associated product which can mitigate the height deviation problem.

Figure 2A:
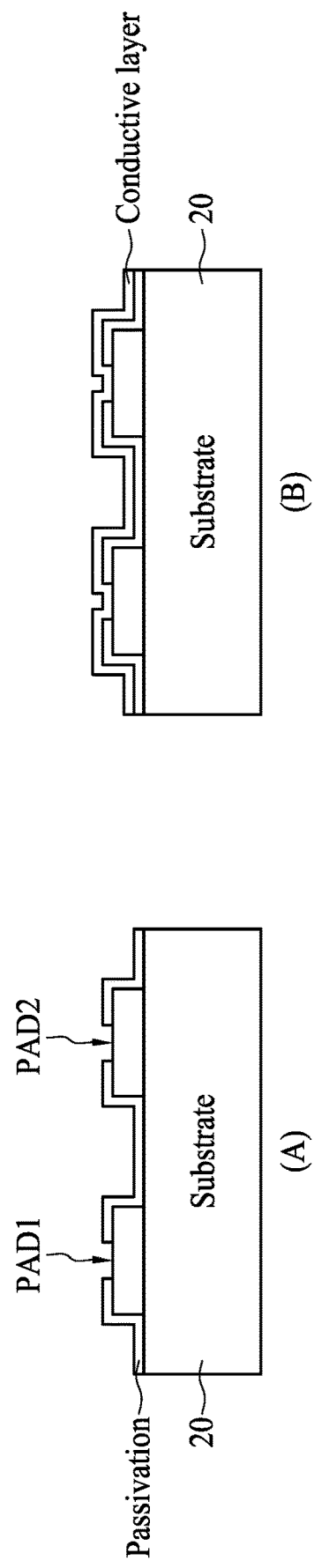
FIGS. 2A-2B are diagrams illustrating a process of manufacturing formation sites corresponding to bumps according to an embodiment of the present disclosure.
Figure 2B:
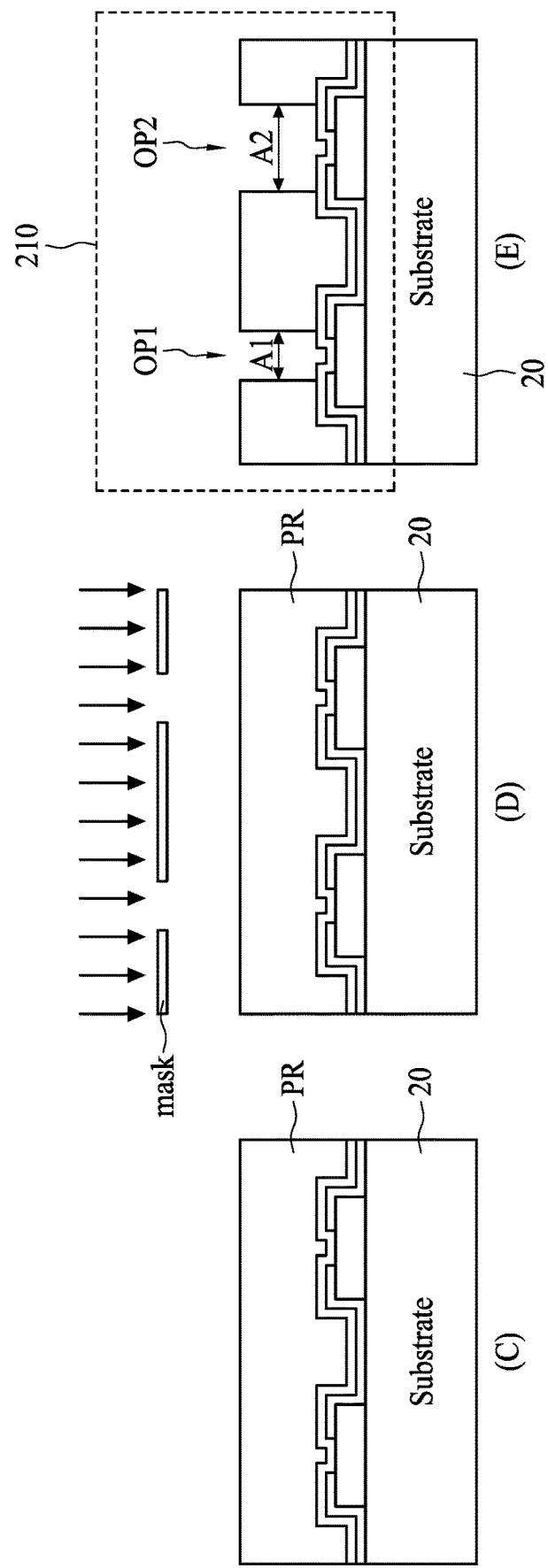

FIGS. 2A-2B are diagrams illustrating operations of manufacturing formation sites corresponding to bumps according to an embodiment of the present disclosure. In step (A) of FIG. 2A, a wafer 20 is prepared for forming conductive bumps. It can be observed that metal pads PAD1 and PAD2 are formed on the wafer 20 (i.e., the substrate) with a passivation layer covering on it. In this embodiment, the metal pads PAD1 and PAD2 may be made from copper, or aluminum, etc. The passivation layer may be made from silicon nitride (SiN) or silicon dioxide (SiO2), and the material of the passivation layer should not be limited by the present disclosure. Next, in step (B) of FIG. 2A, a conductive layer configured as under bump metallurgy (UBM) or seed layer is sputtered as a diffusion barrier and a bump adhesion, and further forms a connection between the bump and the pad. In this embodiment, the conductive layer may be made from TiN, TaN, copper or titanium or any other suitable material which should not be limited by the present disclosure either. Next, a photolithography operation will be performed on the wafer 20 and the operation will be described in FIG. 2B. It should be noted that a dielectric layer (not shown in FIG. 2A) may be coated between the passivation layer and the conductive layer as a protection layer or an isolation layer. In this embodiment, the dielectric layer may be made from polyimide, and the material of the dielectric layer should not be limited by the present disclosure either.

In step (C) of FIG. 2B, a photosensitive material layer or a photoresist (PR) layer is coated. In this embodiment, the photoresist may be a positive photoresist or a negative photoresist, and the type of the photoresist should not be limited by the present disclosure either. In step (D) of FIG. 2B, a mask is disposed above the wafer and the coated PR is exposed with ultraviolet (UV) light, electron beam, or ion beam. In step (E) of FIG. 2B, the PR is patterned after exposure, and a patterned mask 210 is thus provided on the substrate. It can be observed that, openings OP1 and OP2 are formed in the PR after the exposure, where each of the opening OP1 and OP2 is regarded as the formation site for corresponding bump. In addition, each opening exposes a bottom surface which is considered as a cross-sectional area (noted as "A1" and "A2" in FIG. 2B) of the formation site.

Figure 3A:
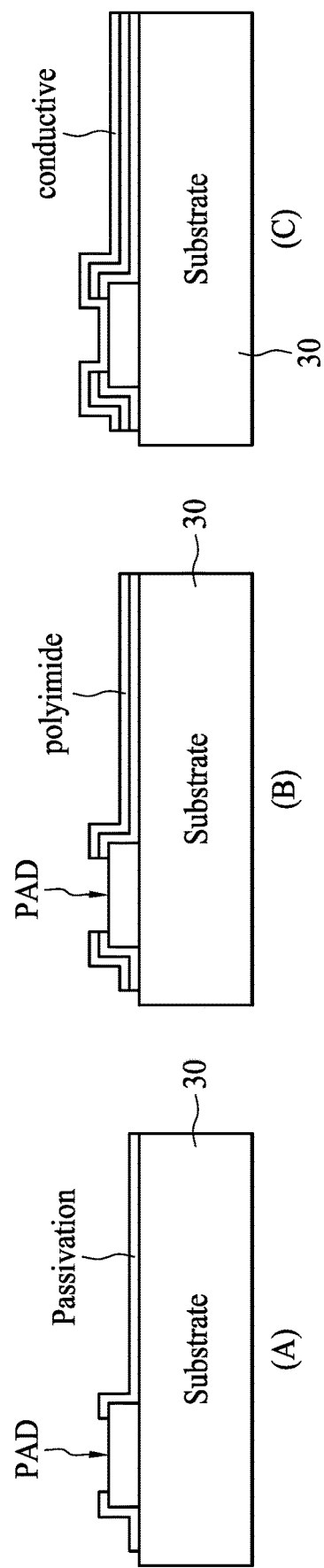
FIGS. 3A-3B are diagrams illustrating a process of manufacturing formation sites corresponding to bumps according to another embodiment of the present disclosure.
Figure 3B:
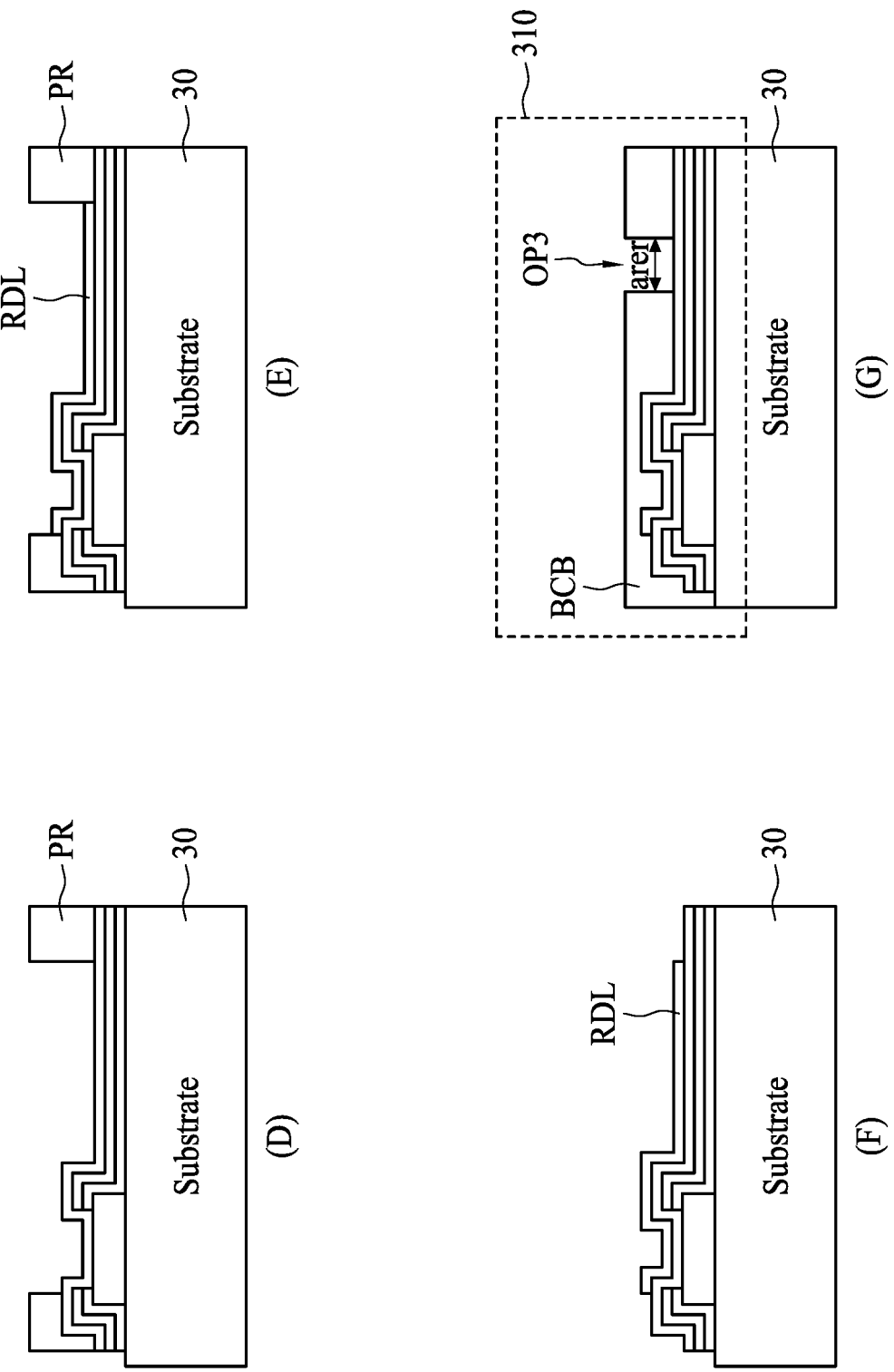

FIG. 3A-FIG. 3B are diagrams illustrating a manufacturing process of conductive bumps according to another embodiment of the present disclosure. In step (A) of FIG. 3A, a wafer 30 is prepared for forming conductive bumps. It can be observed that a metal pad is formed on the wafer 30 (i.e., the substrate) with a passivation layer covers on it. In this embodiment, the metal pad may be made from copper, and the passivation layer may be made from silicon nitride (SiN) or silicon dioxide (Sio2). The materials of the metal pad and the passivation layer should not be limited by the present disclosure. Next, in step (B) of FIG. 3A, a dielectric layer is coated on the passivation layer as a protection layer or an isolation layer. In this embodiment, the dielectric layer may be made from polyimide, however, the material of the dielectric layer should not be limited by the present disclosure either. In step (C) of FIG. 3A, a conductive layer configured as under bump metallurgy (UBM) or seed layer is sputtered on the dielectric layer. In this embodiment, the conductive layer may be made from TiN, TaN, copper or titanium or any other suitable material which should not be limited by the present disclosure either. Some steps might be omitted in FIG. 3A for brevity, for example, after the dielectric layer is coated, an etching step might be executed to form the dielectric layer as shown in step (B) of FIG. 3A. In addition, the formation of the polyimide may go through steps such as coating, exposing, developing, curing, etc. Next, a photolithograph operation is executed.

In step (D) of FIG. 3B, a photosensitive material layer or a photoresist layer is coated. In this embodiment, the photoresist (PR) may be a positive photoresist or a negative photoresist, however, the type of the photoresist should not be limited by the present disclosure either. In step (E) of FIG. 3B, a re-distribution layer (RDL) is coated on the conductive layer. In this embodiment, the RDL may be made from copper-bearing titanium alloy for rerouting, however, the material of the RDL should not be limited by the present disclosure. In step (F) of FIG. 3B, the PR is stripped by a PR stripper. In step (G) of FIG. 3B, another dielectric layer is coated on the RDL and the conductive layer, and a patterned mask 310 is thus provided on the substrate. In this embodiment, the dielectric layer may be made from benzocyclobutene (BCB), however, the material of the dielectric layer should not be limited by the present disclosure. The patterned mask 310 includes an opening OP3 where the opening OP3 is regarded as the formation site for corresponding bump. In addition, each opening exposes a bottom surface which is considered as a cross-sectional area (noted as "area" in FIG. 3B) of the formation site. Some steps might be omitted in FIG. 3B for brevity, for example, the formation of the PR layer may go through steps such as coating and exposing as mentioned in FIG. 2B. Those skilled in the art should understand the photolithography operation after reading the embodiment of FIG. 2B. Provided that the results produced are substantially the same, those skilled in the art should understand the steps shown in FIGS. 3A to 3B are not required to be performed in the exact order. It should be noted that the operation for forming the formation sites is not limited in the embodiments of FIGS. 2A to 3B. Those skilled in the art should understand alternative operations for forming the formation site.

Figure 4:
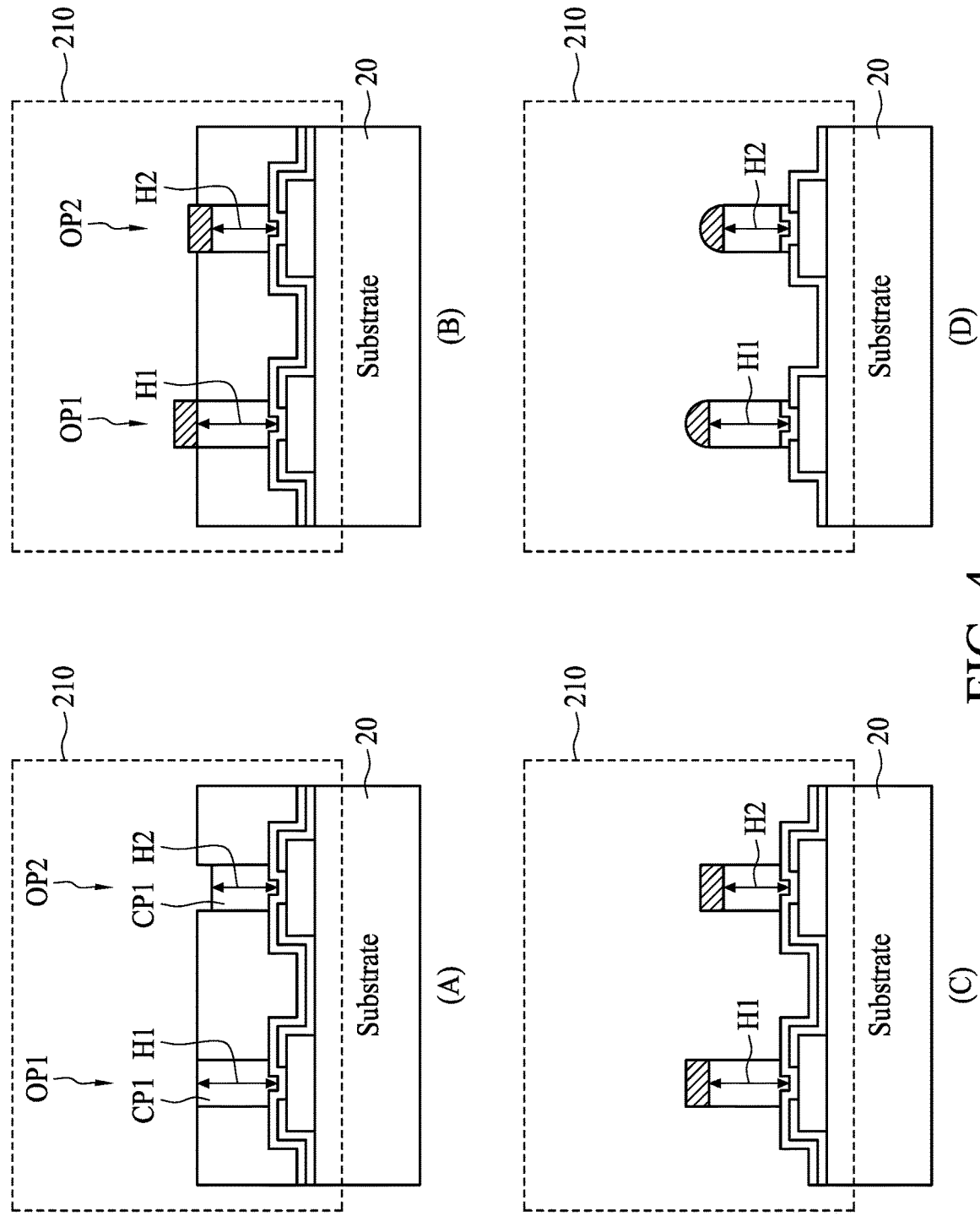
FIG. 4 is a diagram illustrating a process of forming conductive bumps on the formation sites shown in FIG. 2B according to an embodiment of the present disclosure.

FIG. 4 is a diagram illustrating an operation of forming conductive bumps on the formation sites shown in FIG. 2B according to an embodiment of the present disclosure. In step (A) of FIG. 4, the openings OP1 and OP2 are simultaneously filled with a conductive material such as copper to form copper pillars CP1 and CP2. In this embodiment, the conductive material (i.e., copper) is electroplated in the openings OP1 and OP2. Next, in step (B) of FIG. 4, a solder layer is electroplated on the copper pillars CP1 and CP2. In Step (C) of FIG. 4, the PR is stripped by a PR stripper. In step (D) of FIG. 4, the solder layer is reflowed, meanwhile, taking copper pillars CP1 and CP2 as the mask, the conductive layer is patterned.

As mentioned above, due to the loading effect, there is a height deviation between the copper pillar CP1 and CP2. For example, the height of the copper pillar formed in opening OP1 is H1 while the copper pillar formed in opening OP2 is H2. The difference between H1 and H2, i.e., H1−H2>k, where k may be a value such as 10 um. Such height deviation may introduce the reliability issue. It should be noted that the operation of forming conductive bumps of FIG. 4 may coordinate with the operation of manufacturing formation sites of FIGS. 3A to 3B or any other different operations.

Figure 5:
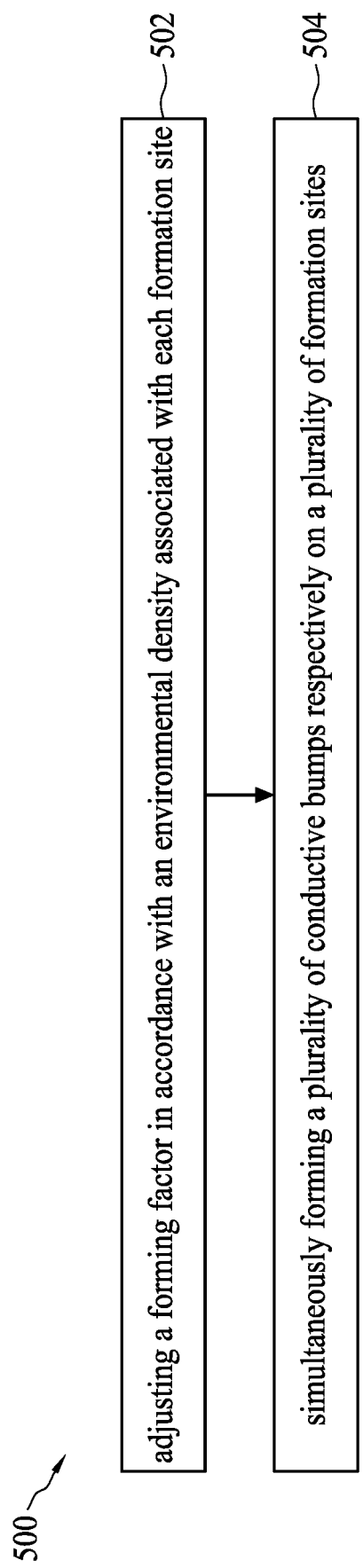
FIG. 5 is a flowchart illustrating a semiconductor device manufacturing method according to an embodiment of the present disclosure.

FIG. 5 is a flowchart illustrating a semiconductor device manufacturing method 500 for forming the bumps according to an embodiment of the present disclosure. Provided that the results are substantially the same, the steps of FIG. 5 are not required to be performed in the exact order. The method 500 is summarized as follows.

In step 502: a forming factor is adjusted in accordance with an environmental density associated with each formation site.

Figure 6A:
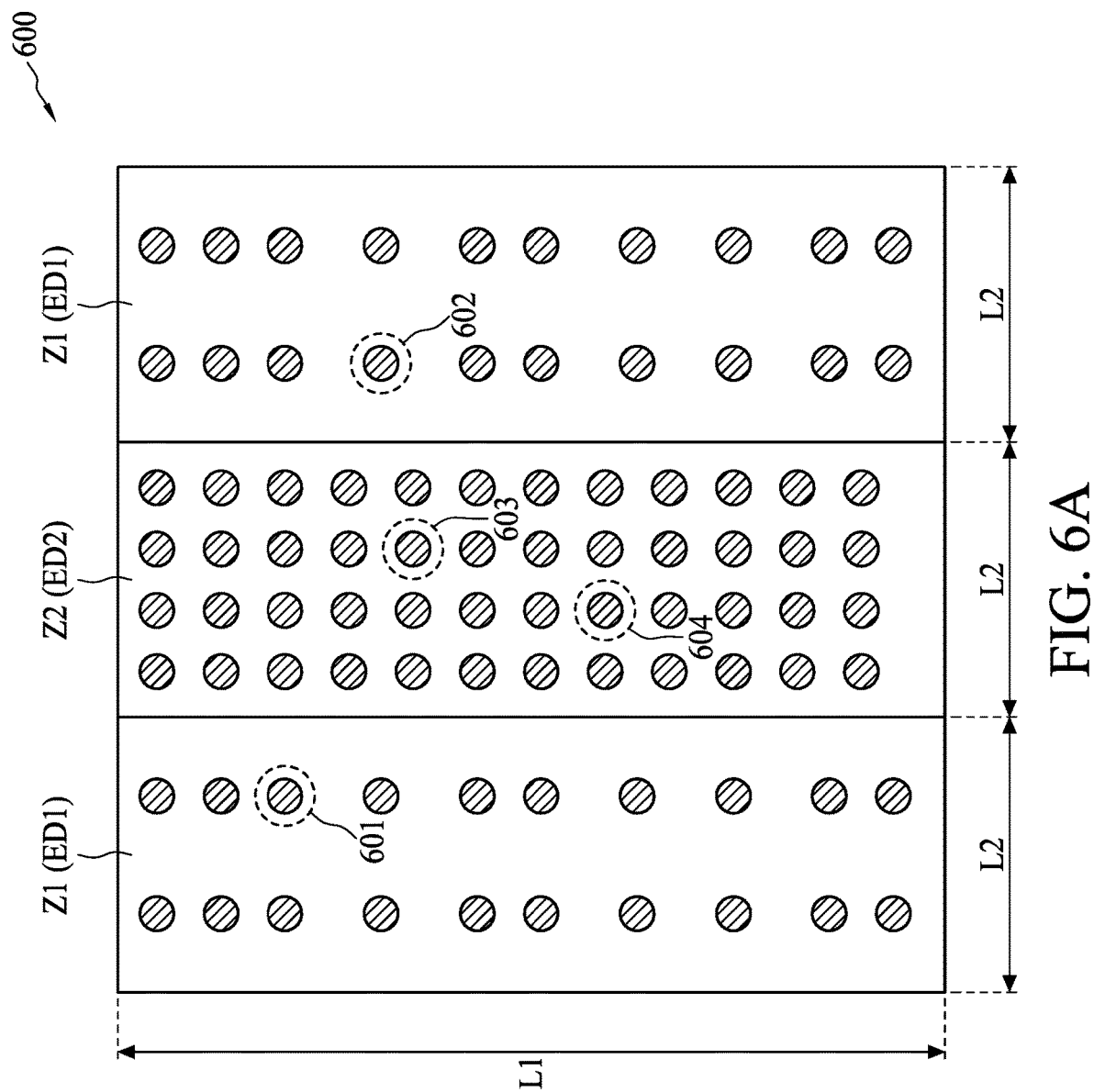
FIG. 6A is a diagram illustrating a die divided into zones based on different environmental density according to an embodiment of the present disclosure.

Refer to FIG. 6A, which is a diagram illustrating an area of die 600 being divided into zones Z1 and Z2 based on different environmental density according to an embodiment of the present disclosure. In practice, depending on the layout of a die, the conductive bumps formed on the die might be arranged in several clusters. In FIG. 6A, the bumps in zone Z2 of the die 600 are formed densely while the bumps formed in zone Z1 (either the left hand side or the right hand side of die 600) are formed loosely. Therefore, the environmental density mentioned in step 502 is determined by a number of neighboring formation sites around each formation site in a predetermined range. In this embodiment, the predetermined range is determined by the quadrilateral range whose area is L1*L2 as shown in FIG. 6A. Those formation sites (e.g., 601) in zone Z1 on the left hand side of FIG. 6A correspond to an environmental density ED1 as same as those (e.g., 602) in zone Z1 on the right hand side of FIG. 6A. Those formation sites (e.g., 603 and 604) in zone Z2 corresponds to an environmental density ED2 greater than ED1.

However, the predetermined range may be another quadrilateral range with a smaller size. Refer to FIG. 6B, which is a diagram illustrating the area of die 600 being divided into zones Z1' and Z2' based on different environmental density according to another embodiment of the present disclosure. In this embodiment, the predetermined range with a smaller size is utilized. For example, the predetermined range is determined by the quadrilateral range whose area is L3*L2 as shown in FIG. 6B, where L3 is half of L1 in this embodiment. With such configurations, those formation sites in zone Z1' located on four corners of die 600 correspond to the same environmental density ED1', and those formation sites in zone Z2' located at the middle of die 600 correspond to an environmental ED2' greater than ED1'. Those skilled in the art should understand that the environmental density ED1' is identical to ED1 considering they both include the same number of formation sites in unit area. Likewise, the environmental density ED2' is identical to ED2.

It should be noted that the quadrilateral range may be a unit exposure area of the photolithography operation mentioned in FIGS. 2B and 3B. However, this should not be limited by the present disclosure. Refer to FIG. 6A again, with such configurations, the forming factor which is mentioned in step 502 for those formation sites having the same environmental density is adjusted to the same. In other words, the forming factors corresponding to the formation sites 601 and 602 are identical after step 502, and the forming factors corresponding to the formation sites 603 and 604 are identical after step 502. It should be noted that the number of the formation sites formed in each zone of the die 600 is only for illustrative purpose, and should not be limited by the present disclosure. In addition, the predetermined range does not have to be a quadrilateral range. In other embodiments, the predetermined range may be a circle or other shape based on the layout of the die.

Figure 7:
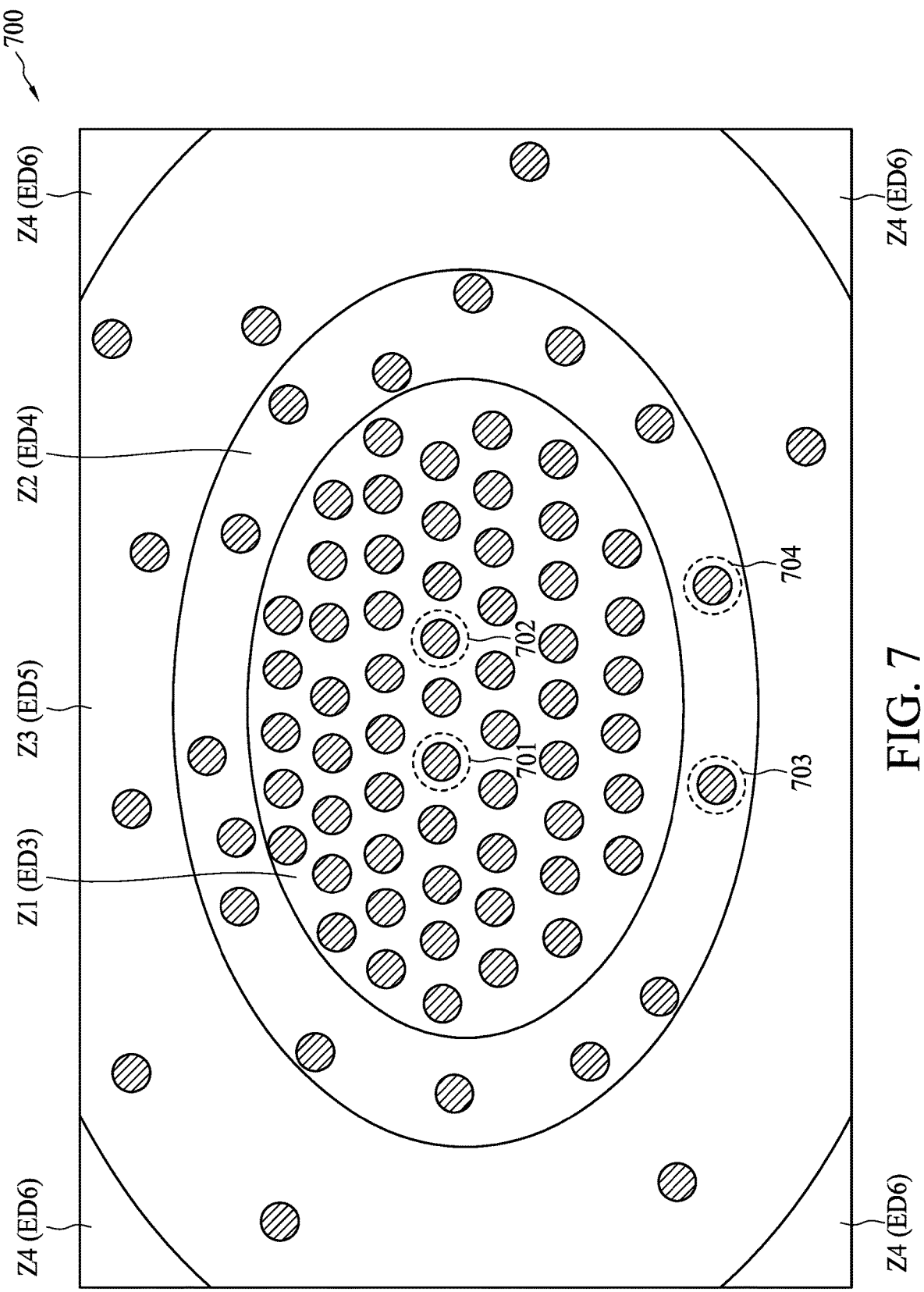
FIG. 7 is a diagram illustrating a die divided into zones based on different environmental density according to another embodiment of the present disclosure.

Refer FIG. 7, which is a diagram illustrating a die 700 divided into zones Z1 to Z4 based on different environmental density according to another embodiment of the present disclosure. In FIG. 7, the bumps in the zone Z1 of the die 700 are formed densely while the bumps in the zones Z2, Z3 and Z4 of the die 700 are formed loosely. Those formation sites (e.g., 701 and 702) in zone Z1 corresponds to an environmental density ED3, those formation sites (e.g., 703 and 704) in zone Z2 corresponds to an environmental density ED4 smaller than ED3, those formation sites in Z3 corresponds to an environmental density ED5 smaller than ED4. In FIG. 7, there is no formation site depicted in zone Z4 which indicates that an environmental density ED6 corresponding to zone Z4 may by the lowest. With such configurations, the forming factor which is mentioned in step 502 for those formation sites having the same environmental density is adjusted to the same. In other words, the forming factors corresponding to the formation sites 701 and 702 are identical after step 502, and the forming factors corresponding to the formation sites 703 and 704 are identical after step 502. It should be noted that the number of the formation sites formed in each zone of the die 700 is only for illustrative purpose, should not be limited by the present disclosure.

Figure 8:
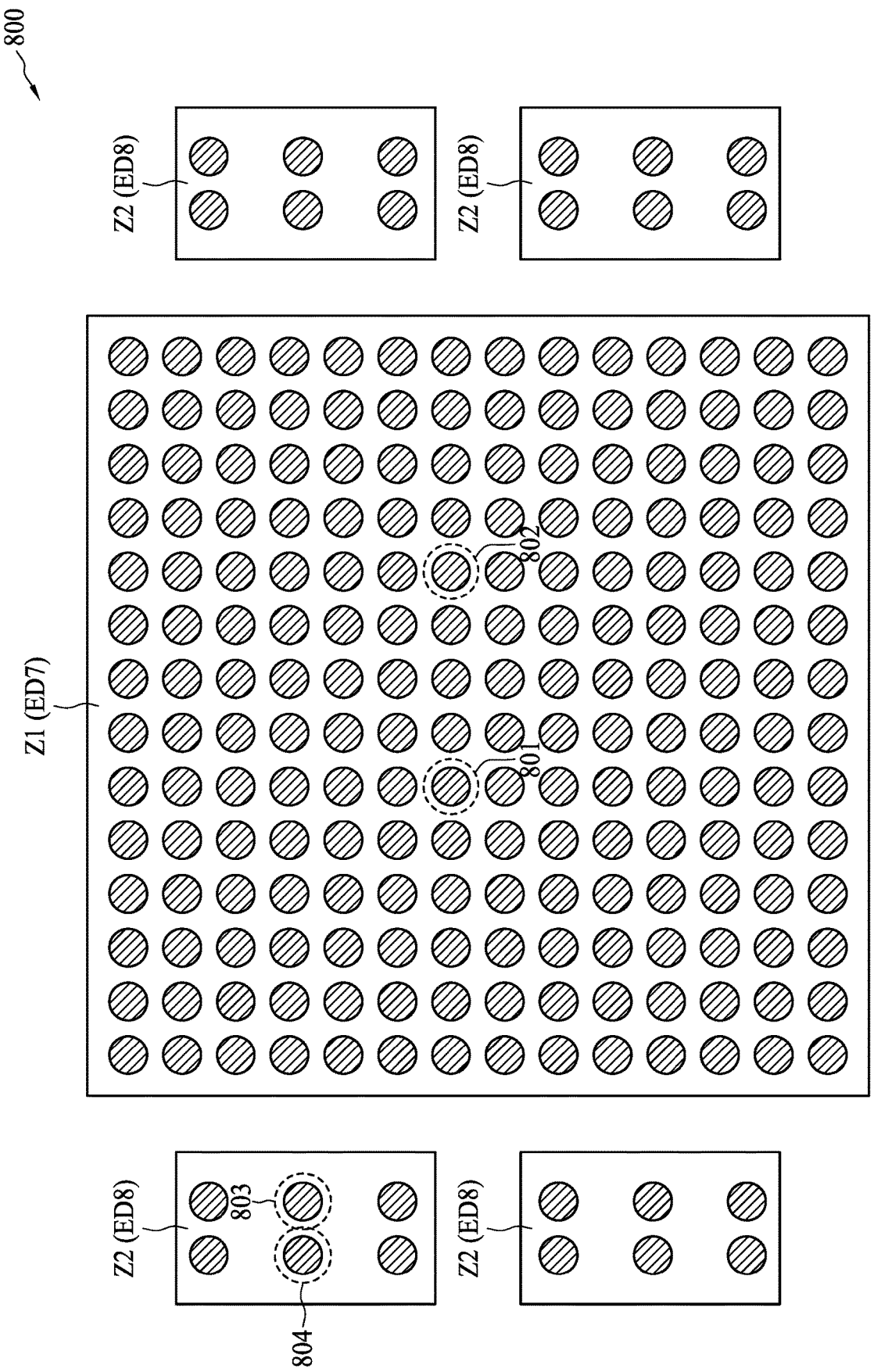
FIG. 8 is a diagram illustrating a die divided into zones based on different environmental density according to yet another embodiment of the present disclosure.

Refer to FIG. 8, which is a diagram illustrating a die 800 divided into zones Z1 to Z2 based on different environmental density according to yet another embodiment of the present disclosure. As shown in FIG. 8, the zone 2 includes 4 parts located on different corners of the die 800 away from the zone Z1. Therefore, there are sparse regions between the zone 1 and zone 2. Those formation sites (e.g., 801 and 802) in zone Z1 correspond to an environmental density ED7, and those formation sites (e.g., 803 and 804) in zone Z2 correspond to an environmental density ED8 smaller than ED7. With such configurations, the forming factor which is mentioned in step 502 for those formation sites having the same environmental density is adjusted to the same. In other words, the forming factors corresponding to the formation sites 801 and 802 are identical after step 502, and the forming factors corresponding to the formation sites 803 and 804 are identical after step 502. It should be noted that the number of the formation sites formed in each zone of the die 800 is only for illustrative purpose, it should not be limited by the present disclosure.

In practice, the dies 600 and 700 may be implemented for System on chip (SOC), and the die 800 may be implemented for SOC with high bandwidth memory (HBM), wherein the zone Z1 of the die 800 is the SOC part and the zone Z2 of the die is the HBM part. However, this is only for illustrative purpose, it should not be limited by the present disclosure.

Figure 9:
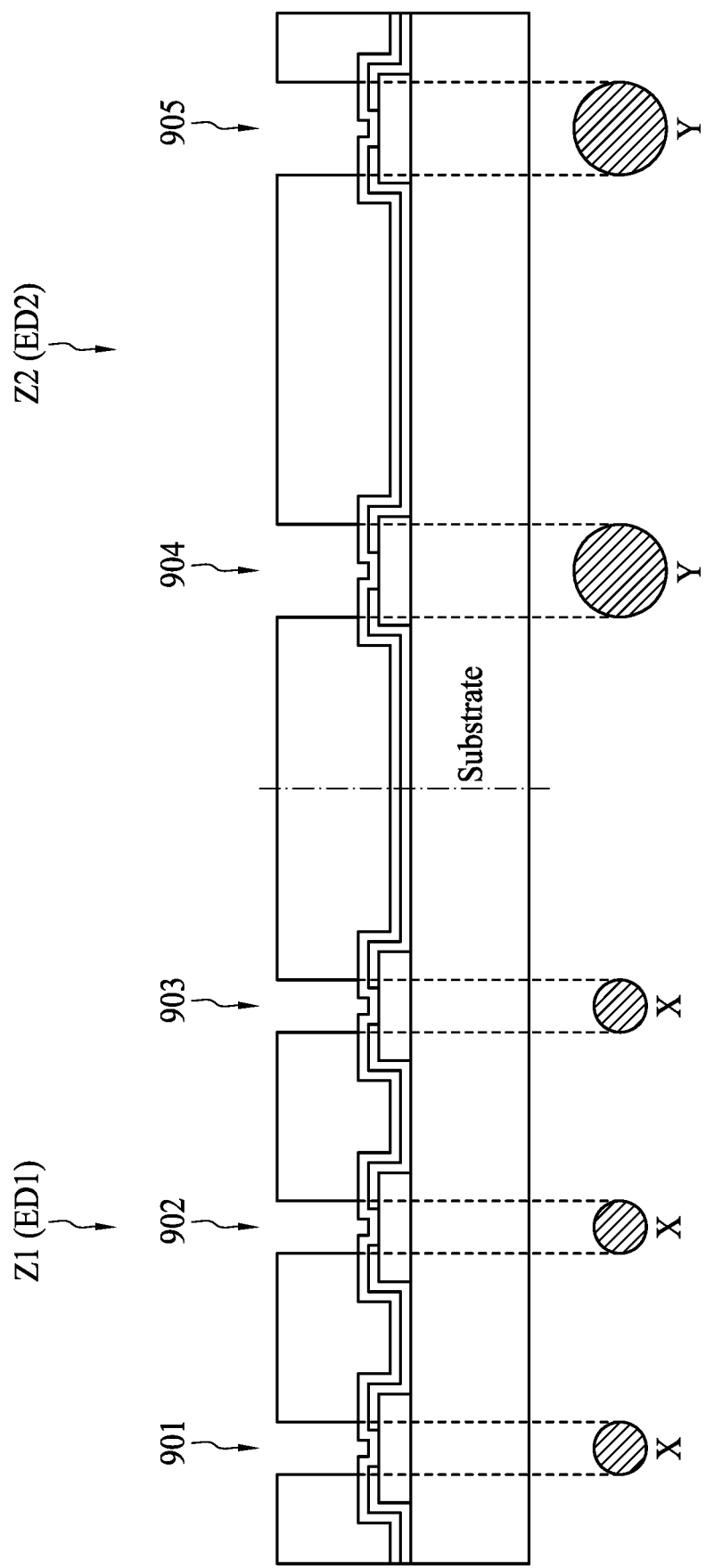
FIG. 9 is a diagram illustrating cross-sectional area corresponding to different environmental density according to an embodiment of the present disclosure.

In one embodiment, the forming factor mentioned in step 502 is an exposed cross-sectional area of each formation site. Refer to FIG. 9, which is a diagram illustrating cross-sectional area corresponding to different environmental density according to an embodiment of the present disclosure. In FIG. 9, the left hand side of the substrate is zone Z1 corresponding to the environmental density ED1 while the left hand side of the substrate is zone Z2 corresponding to the environmental density ED2. The environmental density ED1 is greater than ED2, that is, formation sites (i.e., trenches 901-903) in zone Z1 are formed densely while those (i.e., trenches 904-905) in zone Z2 are formed loosely. According to different environmental density, the total cross-sectional area of those formation sites in zone Z1 is adjusted to be relatively smaller while the total cross-sectional area of those formation sites in zone Z2 is adjusted to be relatively bigger. As shown in FIG. 9, the cross-sectional area for those formation sites in zone Z1 is X while the cross-sectional area for those formation sites in zone Z2 is Y, and Y is greater than X. When the environmental density ED1 is greater than the environmental density ED2 by 15%, the cross-sectional area Y is greater than the cross-sectional area X by 10%.

Refer to FIG. 5 again, in step 504, a plurality of conductive bumps are simultaneously formed on a plurality of formation sites respectively. After the forming factor is adjusted, the conductive material (e.g., copper) mentioned in FIG. 4 is simultaneously filled within the formation site to form the conductive bumps.

Figure 10:
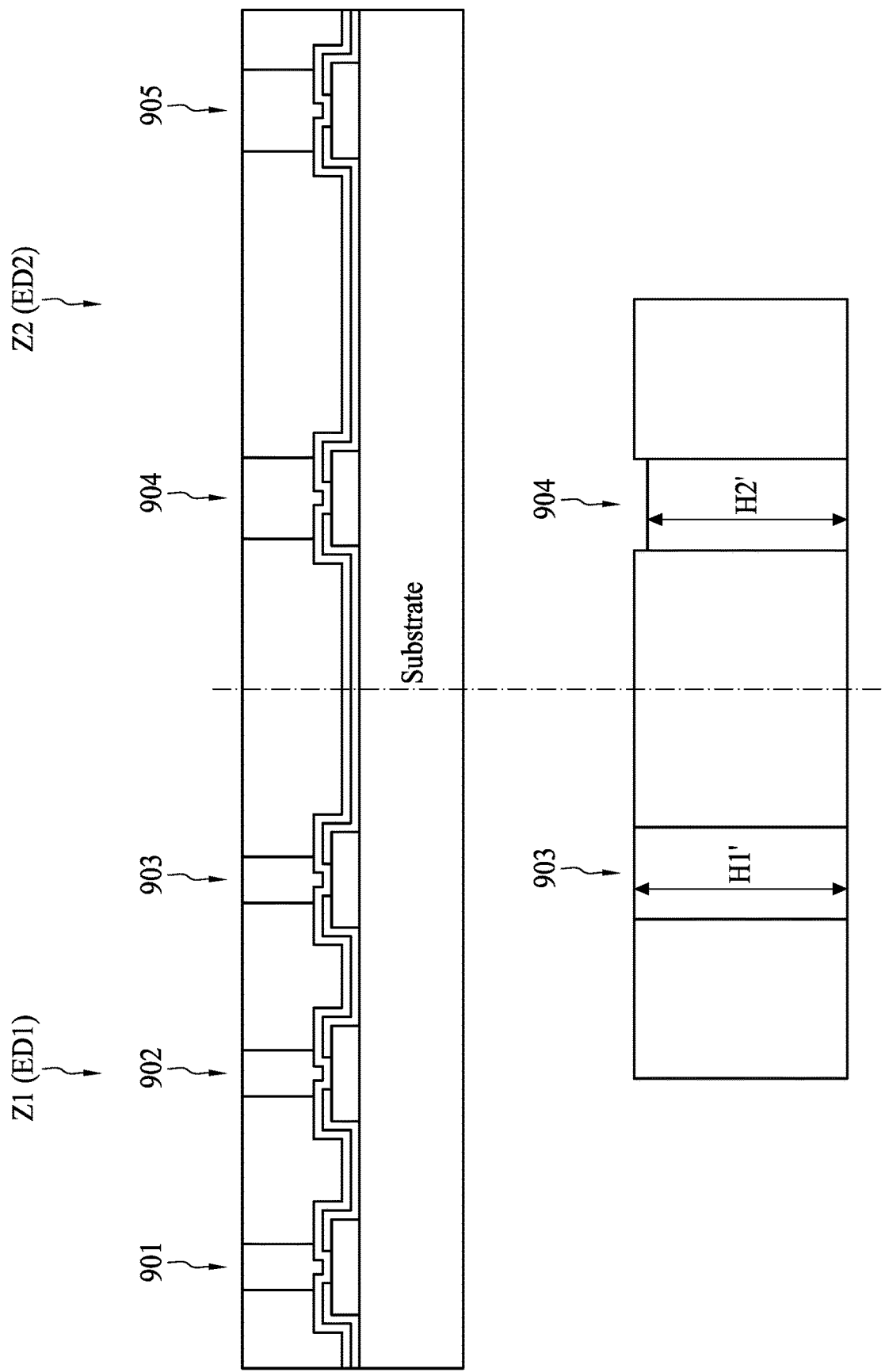
FIG. 10 is a diagram illustrating the copper pillars after the forming factor is adjusted according to an embodiment of the present disclosure.

Refer to FIG. 10, which is a diagram illustrating the copper pillars after the forming factor is adjusted according to an embodiment of the present disclosure. By adjusting the cross-sectional area according to different environmental density, when the conductive material (e.g., copper) mentioned in FIG. 4 is simultaneously filled in the trenches 901-905, the inter-bump height uniformity between those copper pillars formed in trenches 901-905 is smaller than a value. For example, the height of the copper pillars formed in the zone 1 is H1' while the height of the copper pillars formed in the zone 2 is H2'. The difference between H1' and H2', i.e., H1'−H2'<k, where k may be a value such as 10 um. The height deviation problem mentioned above is thus effectively mitigated.

Figure 11:
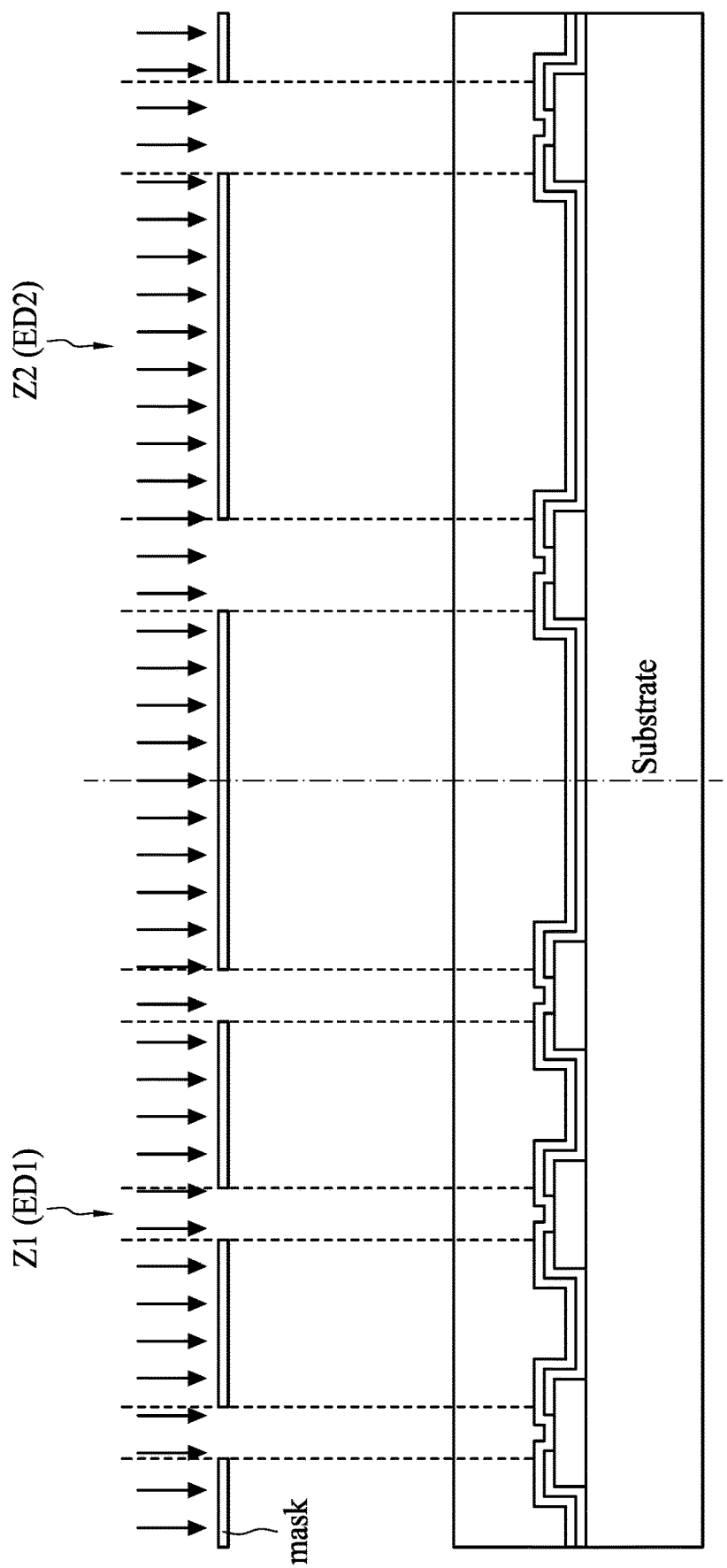
FIG. 11 is a diagram illustrating the photolithography operation according to an embodiment of the present disclosure.

To adjust the cross-sectional area of each formation site, a pad size of the mask used in the photolithography operation may be changed according to different environmental density. Refer to FIG. 11 in conjunction with FIG. 9, where FIG. 11 is a diagram illustrating the photolithography operation according to an embodiment of the present disclosure. To obtain different cross-sectional area according to different environmental density, after the PR is coated on the substrate, different sizes of masks for the photolithography operation are used. For example, to obtain the trenches 901-903 with the smaller cross-sectional area X, the used mask for manufacturing those formation sites in zone Z1 is relatively smaller. To obtain the trenches 904-905 with the bigger cross-sectional area Y, the used mask for manufacturing those formation sites in zone Z2 is relatively bigger. In other words, the forming factor is not limited to be the cross-sectional area of each formation site. In other embodiments, the forming factor is the pad size of mask used in the photolithography operation. The pad size of mask is adjusted according to different environmental density.

To adjust the cross-sectional area of each formation site, the exposure energy used in the photolithography operation may be changed according to different environmental density. For example, to obtain the openings 901-903 with the smaller cross-sectional area X, the exposure energy for manufacturing those formation sites in zone Z1 is relatively smaller. To obtain the openings 904-905 with the bigger cross-sectional area Y, the exposure energy for manufacturing those formation sites in zone Z2 is relatively bigger. In other words, the forming factor is the exposure energy used in the photolithography operation. The exposure energy is adjusted according to different environmental density. In some embodiments, the forming factor is a parameter of an optical proximity correction (OPC) of the photolithography operation. The parameter is adjusted according to different environmental density. However, the forming factor is not limited to be those mentioned above.

Figure 12:
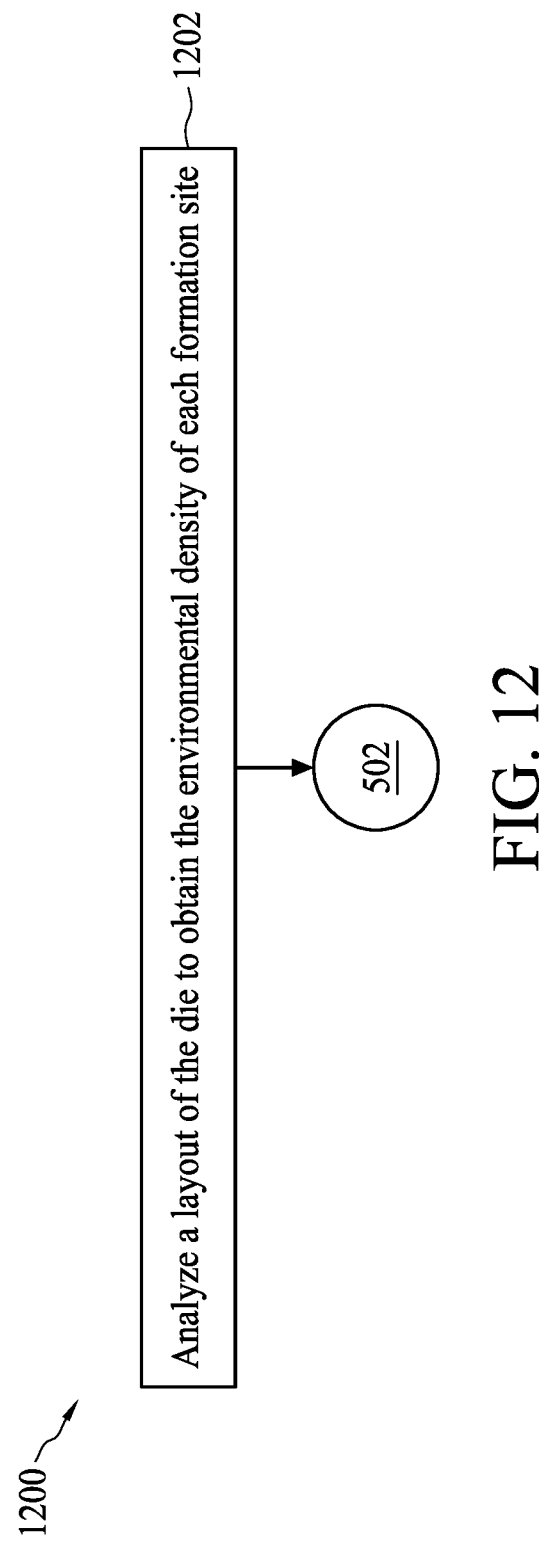
FIG. 12 is a flowchart illustrating the semiconductor device manufacturing method 1200 according to another embodiment of the present disclosure.

To learn the different environmental density in die, the method 500 may further include an additional step. Refer to FIG. 12, which is a flowchart illustrating the semiconductor device manufacturing method 1200 according to another embodiment of the present disclosure. In step 1202, a layout of the die is analyzed to obtain the environmental density of each formation site in the die. The layout may be analyzed by various ways. Next, step 502 is performed.

Figure 13:
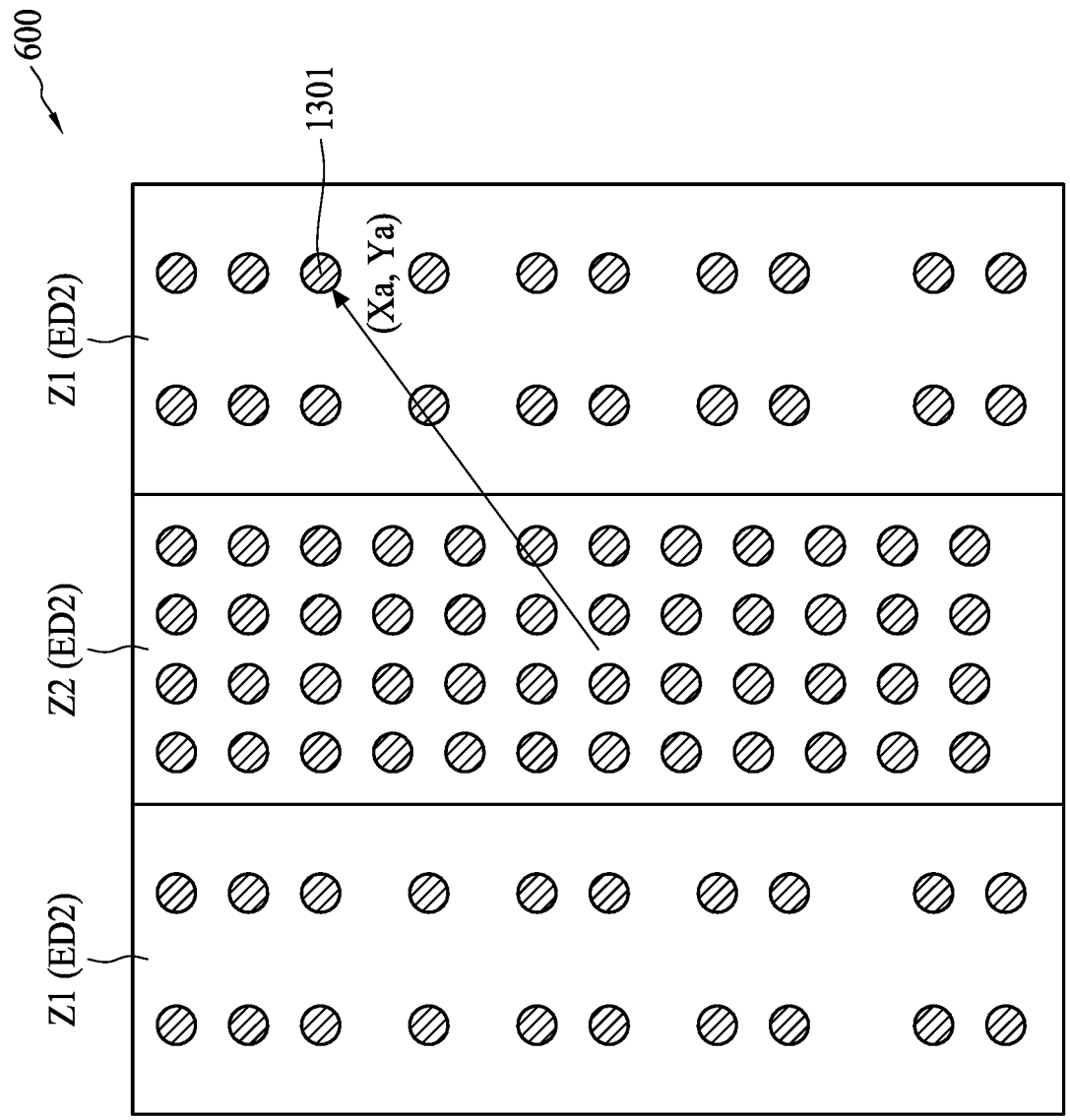
FIG. 13 is a diagram illustrating a coordinate of a formation site on a die according to an embodiment of the present disclosure.

As mentioned above, the forming factor is adjusted in accordance with an environmental density associated with each formation site. For example, the forming factor may be cross-sectional area of each formation site, the pad size of the mask used in the photolithography operation, or the exposure energy in the photolithography operation. In some embodiments, a model is referred to adjust the forming factor. For example, the model is a function involving the coordinate of each formation site in the die and the corresponding environmental density. FIG. 13 is a diagram illustrating a coordinate of a formation site 1301 on die 600 according to an embodiment of the present disclosure. As shown in FIG. 13, a coordinate (Xa, Ya) of the formation site 1301 is acquired. The Coordinate (Xa, Ya) of the formation site 1301 may be acquired by analyzing the layout of die 600 or any other suitable method which should not be limited by the present disclosure. Next, to adjust the forming factor in accordance with the environmental density ED1 associated with formation site 1301, a function F(X, Y, D) is referred. For example, the function F(X, Y, D) can be written as:

$$F(X,Y,D)=a*X+b*Y+c*D+e,$$

where X and Y are the coordinate (Xa, Ya) of formation site 1301, D is the environmental density ED1 of formation site 1301, and a, b, c, and e are constants. The result outputted from the function F(X, Y, D) is referred to adjust the forming factor. For example, the result outputted from the function F(X, Y, D) may be the parameter of the OPC mentioned above. It should be noted that the coordinated of the formation site may be Cartesian coordinates or polar coordinates, and the type of the coordinate utilized by the function F(X, Y, D) should not be limited by the present disclosure.

Figure 14:
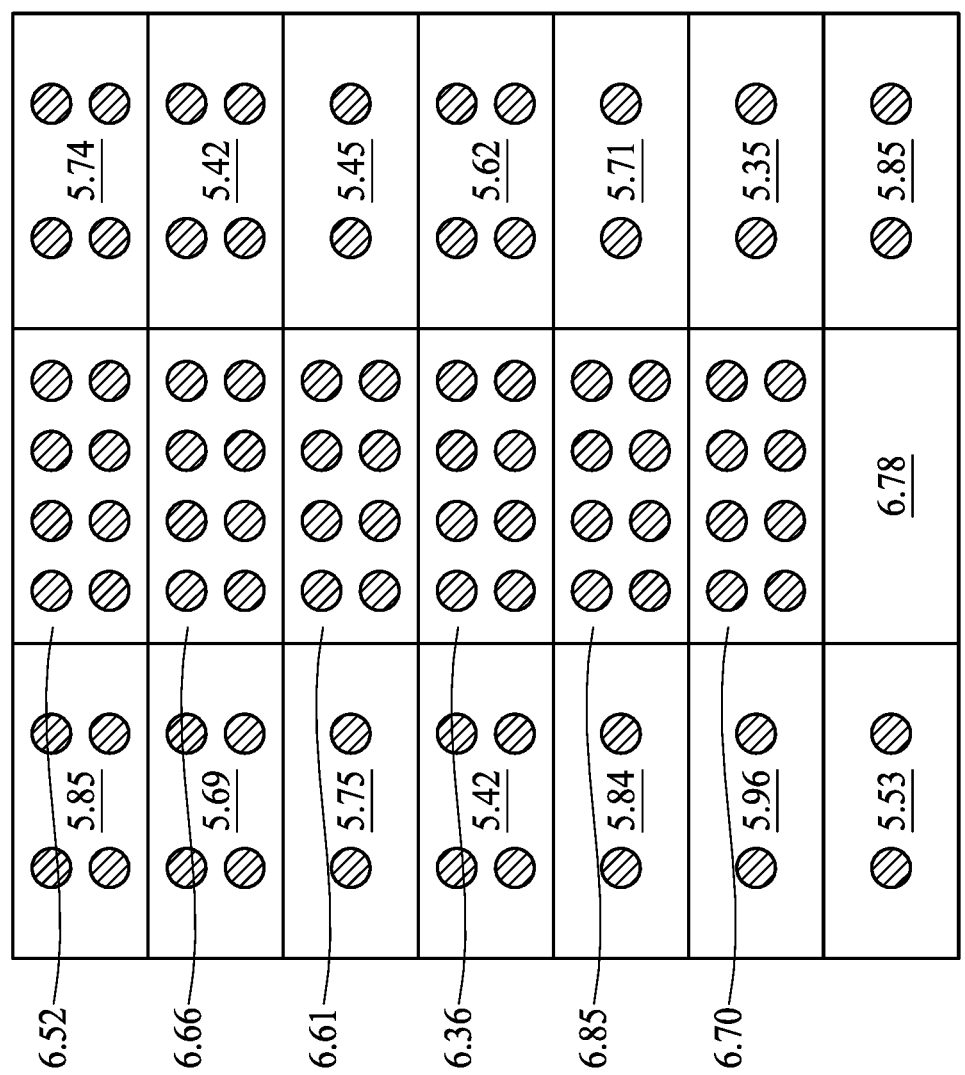
FIG. 14 is a diagram illustrating the parameters of OPC corresponding to each formation site on die 600 according to an embodiment of the present disclosure.

Refer to FIG. 14, which is a diagram illustrating the parameters of OPC corresponding to each formation site on die 600 according to an embodiment of the present disclosure. As shown in FIG. 14, a map related to the parameters of OPC of each formation site is acquired after the function F(X, Y, D) is referred. Those numbers on OPC map corresponding to each formation sites on die 600 are only for illustrative purpose, and it should not be limited by the present disclosure. Next, according to the OPC map shown in FIG. 14, the conductive bumps are simultaneously formed on the formation sites.

In other embodiments, the function F(X, Y, D) can be written as:

$$F(X,Y,D)=a*X^2+b*Y^2+c*X+d*Y+e*X*Y+G(D,D')$$

where X and are the coordinate (Xa,Ya) of the formation site 1301, D is the environmental density ED1 of the formation site 1301, D' is environmental densities of neighboring formation sites around the formation site 1301, G(*) is a function involving the densities D and D', and a, b, c, d, e are constants. Those skilled in the art should readily understand that how to adjust the forming factor by referring to different model after reading the abovementioned embodiments. The detailed description is omitted here for brevity.

In some embodiments, a semiconductor device is disclosed. The semiconductor includes a first formation site and a second formation site for forming a first conductive bump and a second conductive bump. When a first environmental density corresponding to the first formation site is greater than a second environmental density corresponding to the second formation site, a cross sectional area of the second formation site is greater than a cross sectional area of the first formation site; wherein the first environmental density is determined by a number of formation sites around the first formation site in a predetermined range and the second environmental density is determined by a number of formation sites around the second formation site in the predetermined range; wherein a first area having the first environmental density forms an ellipse layout while a second area having the second environmental density forms a strip layout surrounding the ellipse layout.

In some embodiments, a semiconductor device is disclosed. The semiconductor device includes a first metal pad and a second metal pad on a substrate; a passivation layer, covering the first metal pad and the second metal and exposing top surfaces of the first metal pad and the second metal pad; a conductive layer, sputtered on the passivation layer and the first metal and the second metal pad; a photosensitive material layer or a photoresist layer, coated on the conductive layer, wherein the photosensitive material layer or the photoresist layer is patterned to include a first formation site and a second formation site formed on corresponding locations of the first metal pad and the second metal pad respectively, and the first formation site and the second formation site are arranged to form a first conductive bump and a second conductive bump; wherein when a first environmental density corresponding to the first formation site is greater than a second environmental density corresponding to the second formation site, a cross sectional area of the second formation site is greater than a cross sectional area of the first formation site; wherein the first environmental density is determined by a number of formation sites around the first formation site in a predetermined range and the second environmental density is determined by a number of formation sites around the second formation site in the predetermined range.

In some embodiments, a semiconductor device is disclosed. The semiconductor device includes a substrate; a plurality of metal pads on the substrate; a passivation layer on the metal pads; a conductive layer sputtered on the passivation layer; a photoresist layer coated on the conductive layer, wherein the photoresist layer includes a plurality of formation sites on the metal pads; a plurality of conductive bumps respectively formed on the plurality of formation sites; wherein when a first environmental density corresponding to a first formation site is greater than a second environmental density corresponding to a second formation site, a cross sectional area of the second formation site is greater than a cross sectional area of the first formation site; wherein the first environmental density is determined by a number of formation sites around the first formation site in a predetermined range and the second environmental density is determined by a number of formation sites around the second formation site in the predetermined range.

What is claimed is:

1. A semiconductor device, comprising:
   a first formation site for forming a first conductive bump; and
   a second formation site for forming a second conductive bump;
   wherein when a first environmental density corresponding to the first formation site is greater than a second environmental density corresponding to the second formation site, a cross sectional area of the second formation site is greater than a cross sectional area of the first formation site;
   wherein the first environmental density is determined by a number of formation sites around the first formation site in a predetermined range and the second environmental density is determined by a number of formation sites around the second formation site in the predetermined range;
   wherein a first area having the first environmental density forms an ellipse layout while a second area having the second environmental density forms a strip layout surrounding the ellipse layout;
   wherein the first formation site corresponds to a forming factor relative to the first environmental density;
   wherein the first formation site corresponds to a coordinate, and the forming factor is adjusted by referring to a model relative to the coordinate and the environmental density;
   wherein the model is a first order model F(x, y, D) represented as:

$$F(X, Y, D)=a*X+b*Y+c*D+e,$$

where X and Y are the coordinate corresponding to the first formation site, D is the environmental density, and a, b, c, and e are constants.

2. The semiconductor device of claim 1, wherein the first formation site is generated by incorporating the first forming factor into a process of generating the first formation site.

3. The semiconductor device of claim 2, wherein the process of generating the first formation site comprises providing a patterned mask on a substrate.

4. The semiconductor device of claim 3, wherein the patterned mask includes a trench exposing a bottom surface configured as an area of the first formation site.

5. The semiconductor device of claim 4, the process of generating the first formation site comprises a photolithography operation, and the predetermined range is determined by a unit exposure area of the photolithography operation.

6. The semiconductor device of claim 5, wherein the photolithography operation comprises disposing a photosensitive material on the substrate and patterning the photosensitive material to form the patterned mask, and the forming factor is an exposure energy.

7. The semiconductor device of claim 5, wherein the forming factor is an exposure energy used in the photolithography operation.

8. The semiconductor device of claim 4, wherein the forming factor is a cross-sectional area of each formation site.

9. A semiconductor device, comprising:
a first metal pad and a second metal pad on a substrate;
a passivation layer, covering the first metal pad and the second metal pad and exposing top surfaces of the first metal pad and the second metal pad;
a conductive layer, sputtered on the passivation layer and the first metal pad and the second metal pad;
a photosensitive material layer or a photoresist layer, coated on the conductive layer, wherein the photosensitive material layer or the photoresist layer is patterned to include a first formation site and a second formation site formed on corresponding locations of the first metal pad and the second metal pad respectively, and the first formation site and the second formation site are arranged to form a first conductive bump and a second conductive bump;
wherein the first formation site corresponds to a forming factor relative to a first environmental density, and the forming factor is adjusted by referring to a model relative to the coordinate and the environmental density;
wherein the model is a second order model $F(x, y, D)$ represented as:

$$F(X, Y, D) = a*X^2 + b*Y^2 + c*X + d*Y + e*X*Y + G(D, D'),$$

where X and Y are the coordinate corresponding to the first formation site, D is the environmental density, D' is environmental densities of neighboring formation sites around the first formation site, G(*) is a function involving the densities D and D', and a, b, c, d, e are constants;
wherein the first environmental density is determined by a number of formation sites around the first formation site in a predetermined range and the second environmental density is determined by a number of formation sites around the second formation site in the predetermined range.

10. The semiconductor device of claim 9, wherein a first area having the first environmental density forms an ellipse layout while a second area having the second environmental density forms a strip layout surrounding the ellipse layout.

11. The semiconductor device of claim 9, wherein a first area having the first environmental density forms a rectangular layout, and a plurality of second area having the second environmental density are disposed on opposite sides of the rectangular layout.

12. The semiconductor device of claim 9, wherein the first formation site is generated by incorporating the first forming factor into a process of generating the first formation site.

13. A semiconductor device, comprising:
a substrate;
a plurality of metal pads on the substrate;
a passivation layer on the metal pads;
a conductive layer sputtered on the passivation layer and the plurality of metal pads;
a re-distribution layer (RDL), coated on the conductive layer;
a dielectric layer, coated on the RDL and the conductive layer, wherein the dielectric layer is patterned to include a plurality of formation sites;
wherein a first formation site of the plurality of formation sites corresponds to a forming factor relative to a first environmental density, and the forming factor is adjusted by referring to a model relative to the coordinate and the environmental density;
wherein the model is a first order model $F(x, y, D)$ represented as:

$$F(X, Y, D) = a*X + b*Y + c*D + e,$$

where X and Y are the coordinate corresponding to the first formation site, D is the environmental density, and a, b, c, and e are constants;
wherein the first environmental density is determined by a number of formation sites around the first formation site in a predetermined range and the second environmental density is determined by a number of formation sites around the second formation site in the predetermined range.

14. The semiconductor device of claim 13, wherein a first area having the first environmental density forms an ellipse layout while a second area having the second environmental density forms a strip layout surrounding the ellipse layout.

15. The semiconductor device of claim 13, wherein a first area having the first environmental density forms a rectangular layout, and a plurality of second area having the second environmental density are disposed on opposite sides of the rectangular layout.

16. The semiconductor device of claim 13, wherein each of the plurality of metal pads includes copper.

17. The semiconductor device of claim 13, wherein the passivation later includes silicon nitride or silicon dioxide.

18. The semiconductor device of claim 13, wherein the dielectric layer includes polyimide.

19. The semiconductor device of claim 13, wherein the conductive layer includes TiN, TaN, copper or titanium.

20. The semiconductor device of claim 13, wherein the RDL includes copper-bearing titanium alloy.

* * * * *